US 6,553,333 B1

(12) United States Patent
Shenk (10) Patent No.: US 6,553,333 B1
(45) Date of Patent: Apr. 22, 2003

(54) SYSTEM AND METHOD FOR CALCULATING AERODYNAMIC PERFORMANCE OF TILTING WING AIRCRAFT

(75) Inventor: Barth W. Shenk, Bellbrook, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 55 days.

(21) Appl. No.: 09/871,232

(22) Filed: May 31, 2001

Related U.S. Application Data

(60) Provisional application No. 60/208,655, filed on May 31, 2000.

(51) Int. Cl.[7] .............................................. G05D 13/00
(52) U.S. Cl. .......................................... 702/182; 701/3
(58) Field of Search .......................... 702/33–36, 57–59, 702/96, 104, 113, 114, 117, 118, 144, 182–185; 701/1, 2, 3–5, 7, 8, 14, 15, 16, 29, 30, 31, 32, 33, 34, 35, 51, 56, 300–302, 213, 214

(56) References Cited

U.S. PATENT DOCUMENTS

| | | | |
|---|---|---|---|
| 3,572,612 A | | 3/1971 | Irbitis .............................. 244/7 |
| 3,666,209 A | | 5/1972 | Taylor ........................... 244/7 C |
| 4,729,102 A | * | 3/1988 | Miller et al. ..................... 360/5 |
| 5,046,684 A | | 9/1991 | Wolkovitch .................. 244/7 A |
| 5,899,410 A | | 5/1999 | Garrett ....................... 244/45 R |
| 5,974,349 A | * | 10/1999 | Levine .......................... 340/945 |
| 6,134,485 A | * | 10/2000 | Tanielian et al. .......... 244/17.13 |
| 6,173,159 B1 | * | 1/2001 | Wright et al. ................. 340/3.5 |
| 6,246,320 B1 | * | 6/2001 | Monroe ....................... 340/506 |
| 6,278,913 B1 | * | 8/2001 | Jiang ....................... 244/158 R |
| 6,385,513 B1 | * | 5/2002 | Murray et al. ............... 340/945 |

* cited by examiner

Primary Examiner—Marc S. Hoff
Assistant Examiner—Edward Raymond
(74) Attorney, Agent, or Firm—Bobby D. Scearce; Thomas L. Kundert (57) ABSTRACT

Aerodynamic performance parameters for aircraft configurations are calculated using an aerodynamic performance system and method. The aerodynamic performance system in a workstation includes a processor circuit having a processor and a memory. Additionally, the system includes aerodynamic performance logic stored on the memory and executable by the processor. The aerodynamic performance logic includes logic that calculates a number of aerodynamic performance parameters for a configuration. Further, the logic generates an aerodynamic performance report to be sent to a client via a network. The aerodynamic performance report lists at least one of the aerodynamic performance parameters.

20 Claims, 7 Drawing Sheets

SYSTEM AND METHOD FOR CALCULATING AERODYNAMIC PERFORMANCE OF TILTING WING AIRCRAFT

CROSS-REFERENCE TO RELATED APPLICATION

This application claims priority of the filing date of the provisional Application Serial No. 60/208,655 filed May 31, 2000, the entire contents of which are incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

The present invention relates to the field of calculating aerodynamic performance of an aircraft. More particularly, the invention relates to a system and method for calculating aerodynamic performance of a tilting wing aircraft.

Design of an aerodynamic vehicle such as a short takeoff and landing (STOL) aircraft is extremely complex and involves the evaluation of hundreds of configurations. For each configuration option, hundreds or even thousands of conceptual designs must be evaluated. One configuration option for a STOL aircraft design is a tilting wing configuration, which maximizes the use of the wing surface for lift generation. The tilting wing configuration adds further complexities to the design process as compared to the conventional fixed wing aircraft. For example, various aerodynamic performance parameters must be evaluated over the translation range of the tilting wing. The evaluation includes calculating lift, drag, pitching moment or the like.

One proposed method to conduct such evaluation would be to fabricate a model of each conceptual design and conduct wind tunnel testing. However, the fabrication and wind tunnel testing of each conceptual design model would be extremely time-consuming and expensive. Alternatively, a computer model of each conceptual design may be made and tested using empirical methodologies developed from blown-wing STOL configuration investigations. Currently, multiple methodologies must be used. Further, most methodologies focus on calculating lift, drag and the piece wise contributions of different phenomena (i.e., vectored thrust, induced vorticity, angle-of-attack, etc.) to the total axial and normal force.

Other parameters such as trim and moment calculations, which are critical to STOL configuration development and evaluation, require accurate estimation of the effective points of action. In the case of blown wings, most of these force locations fluctuate as functions of blowing coefficient, local geometry, and angle-of-attack. At lower speeds and high-power settings inherent in STOL operations, small force contributions normally negligible in conventional flight may become key elements in general stability characteristics and functional control effectors. Most methodologies do not adequately calculate the effective points of action for trim and moment calculations for blown wing configurations, in particular, the low airspeed and high-power setting conditions.

Therefore, there exists a need in the art for a system and a method that makes inter-related calculations of thrust, normal force, axial force, pitching moments, trim and flight path angle as functions of airspeed and tilt angle.

SUMMARY OF THE INVENTION

The principal object of the present invention is to provide a system and a method that calculates aerodynamic performance parameters for aircraft configurations.

According to one aspect of the invention, the invention is an aerodynamic performance system in a workstation which includes a processor circuit having a processor and a memory. Additionally, the system includes aerodynamic performance logic stored on the memory and executable by the processor. The aerodynamic performance logic includes logic that calculates a number of aerodynamic performance parameters for a configuration. Further, the logic generates an aerodynamic performance report to be sent to a client via a network. The aerodynamic performance report lists at least one of the aerodynamic performance parameters.

According to another aspect of the invention, the aerodynamic performance system calculates the aerodynamic performance parameters for a configuration on a computer system.

According to yet another aspect, the logic calculates a number of aerodynamic performance parameters in a number of configurations wherein the logic compares the aerodynamic performance parameters of at least one of the configurations with the aerodynamic performance parameters of another configuration.

BRIEF DESCRIPTION OF DRAWINGS

The invention can be understood with reference to the following drawings. The components in the drawings are not necessarily to scale. Also, in the drawings, like reference numerals designate corresponding parts throughout the several views.

DETAILED DESCRIPTION OF THE INVENTION

Figure 1:
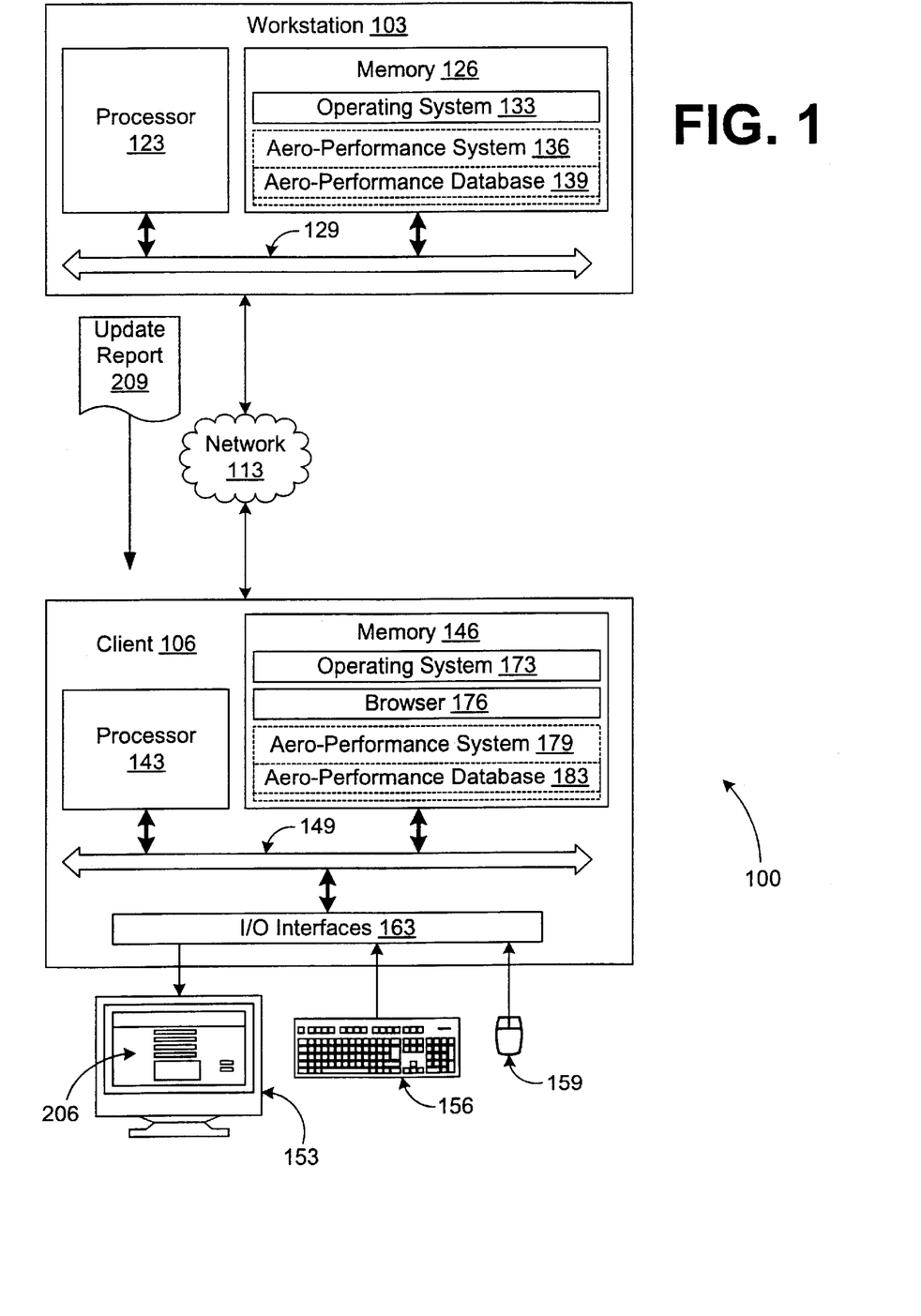
FIG. 1 is a drawing of a data processing network including a workstation and a client according to an aspect of the present invention.

With reference to FIG. 1, shown is a data processing network 100 according to an aspect of the present invention. The data processing network 100 includes a workstation 103 and a client 106. Note, that the data processing network 100 may include multiple other workstations and clients as is generally known by those with ordinary skill in the art. The workstation 103 and client 106 are coupled to a network 113. The network 113 may be, for example, the Internet, wide area networks (WANs), local area networks, or other suitable networks, etc., or any combination of two or more such networks.

According to the present invention, the workstation 103 calculates the aerodynamic performance of aircraft configurations such as tilt wing configurations stored on servers or clients such as the client 106. Before the discussion of the particular operation and functional aspects of the present invention, a more detailed description of the various components in the data processing network 100 is first provided.

In this regard, the workstation 103 may comprise, for example, a computer system or other device with like capability having a processor circuit that includes a processor 123 and a memory 126, both of which are coupled to a local interface 129. The local interface 129 may comprise, for example, a data bus with an accompanying control/address bus as is generally known by those with ordinary skill in the art. Stored on the memory 126 and executable by the processor 123 are an operating system 133 and an aerodynamic performance system 136 (Aero-Performance System). The aerodynamic performance system 136 includes an aerodynamic performance database 139 (Aero-Performance Database) that is accessed and manipulated by the aerodynamic performance system 136 as will be described.

The client 106 may also comprise, for example, a computer system or other device with like capability having a processor circuit with a processor 143 and a memory 146, both of which are coupled to a local interface 149. The local interface 149 may comprise, for example, a data bus with an accompanying control/address bus as is generally known by those with ordinary skill in the art. The client 106 also includes various peripheral devices such as a display device 153, a keyboard 156, and a mouse 159 as shown. The display device 153, keyboard 156, and the mouse 159 are all coupled to the local interface 149 through various input/output interfaces 163. The input/output interfaces 163 may comprise, for example, various input and output cards which are generally known by those with ordinary skill in the art. In addition, the client 106 may include other peripheral devices such as, for example, keypads, touch pads, touch screens, microphones, scanners, joysticks, or one or more push buttons, indicator lights, speakers, printers, etc. The display device 153 may be, for example, a cathode ray tube (CRT), a liquid crystal display screen, a gas plasma-based flat panel display, etc.

Stored on the memory 146 and executable by the processor 143 is an operating system 173, a browser 176, and an aerodynamic performance system 179 (Aero-Performance System) that includes an aerodynamic performance database 183 (Aero-Performance Database). The aerodynamic performance system 179 is executed on the client 106 as an additional embodiment of the present invention as will be discussed.

The memories 126 and 146 may include both volatile and nonvolatile memory components. Volatile components are those that do not retain data values upon loss of power. Nonvolatile components are those that retain data upon a loss of power. Thus, the memories 126 and 146 may comprise, for example, random access memory (RAM), read-only memory (ROM), hard disk drives, floppy disks accessed via an associated floppy disk drive, compact disks accessed via a compact disk drive, magnetic tapes accessed via an appropriate tape drive, and/or other memory components, or a combination of any two or more of these memory components.

Also, each of the processors 123 and 143 may represent multiple processors and each of the memories 126 and 146 may represent multiple memories that operate in parallel processing circuits, respectively. In such a case, the local interfaces 129 and 149 may be an appropriate network that facilitates communication between any two of the multiple processors or between any processor and any of the memories, etc. The local interfaces 129 and 149 may facilitate memory to memory communication as well. The processors 123 and 143 may be electrical or optical in nature.

In addition, the operating systems 133 and 173 are executed to control the allocation and usage of hardware resources in the workstation 103 and client 106. Specifically, the operating systems 133 and 173 control the allocation and usage of the memories 126 and 146, processing time, and the peripheral devices as well as performing other functionality in the workstation 103 and client 106, respectively. In this manner, the operating systems 133 and 173 serve as the foundation on which applications depend as is generally known by those with ordinary skill in the art.

Next a discussion of the operation of the aerodynamic performance systems 136 and 179 are provided. First, attention is drawn to the operation of the aerodynamic performance system 136 in the workstation 103. In this embodiment of the present invention, the aerodynamic performance system 136 employs a client/server model of operation to calculate aerodynamic performance of multiple configurations for multiple clients 106. To determine whether the aerodynamic performance of a particular configuration, the aerodynamic performance system 136 calculates various performance parameters associated with the particular configuration and may be used to compare with a previously obtained performance report for another configuration. By comparing these performance reports, the aerodynamic performance system 136 can determine whether a particular configuration warrants further analysis.

To begin, a particular client 106 sets up an account with the aerodynamic performance system 136. This may be done, for example, using the browser 176 to access network pages that are generated by the aerodynamic performance system 136 to set up such an account. In this manner, records are kept that includes such information as the user's profile information and other data. The user may also identify one or more configurations that are to be analyzed by the aerodynamic performance system 136. Also, the user should identify one or more vehicle settings that are employed by the aerodynamic performance system 136 to determine an aerodynamic performance envelope for a particular configuration. Vehicle settings are employed as triggers that cause a calculation to be performed and stored in a database for a particular configuration. The vehicle settings could be any setting Which affects the forces acting on the configuration including, for example, the power setting of the engines, air speed of the vehicle, a tilt angle of the wing or a flap setting of the wing flaps for which the aerodynamic performance parameters of the configuration are to be calculated. The vehicle settings may be input as a single setting, as a range of settings, multiple settings, or in another manner.

Alternatively, the vehicle configuration data may be defined in another manner such as, for example, collected data from a wind tunnel test, aerodynamic performance configuration tables, or the like. Such vehicle data should be capable of being quantified in a form recognizable by the aerodynamic performance system 136 before they can be used as should be apparent to one with ordinary skill in the art. To provide a specific example, a user may wish to obtain an aerodynamic performance report for a compound tilting wing configuration with leading edge slats as described in the inventors patent application Ser. No. 09/871,261 entitled Compound Tilting Wing For High Lift Stability And Control Of Aircraft and incorporated by reference herein in its entirety. The compound tilting wing is comprised of a tilting main wing and a fixed leading edge wing portion (sponson). The tilting main wing with a leading edge slat has been previously tested in a wind tunnel. Thus, the wind tunnel data should be quantified in a digital form available to the aerodynamic performance system 136 so that the corresponding data may be used in the aerodynamic performance calculation for the complete configuration. Virtually any type of performance data can be used as a configuration data provided that it can be quantified so that the aerodynamic performance system 136 can integrate the data into the aerodynamic performance calculations.

Upon completion of setting up the initial configurations, the aerodynamic performance system 136 then proceeds to determine the aerodynamic performance of the one or more configurations and associated vehicle settings. This is done by calculating the various forces acting on the configuration due to the changes in the vehicles settings. If more than one configuration is being analyzed, a comparison of the various parameters can be conducted and written out in a performance report.

There are several ways that such a comparison can be performed. In one approach, the aerodynamic performance of one configuration may be calculated and stored in the aerodynamic database and the aerodynamic performance of a subsequent configuration may be compared to the stored configuration and output as spreadsheet or a graph. Another approach may employ the use of a baseline configuration to which all the various configurations are compared. For example, a wind tunnel model may be made and tested of a particular configuration and used as a baseline configuration against which all other configurations are compared to and stored within the memory 126 that can be provided to the aerodynamic performance system 136 when the aerodynamic performance system calculates the aerodynamic performance of a user defined configuration.

Once the aerodynamic performance is determined for a particular configuration, then the aerodynamic performance system 136 generates an aerodynamic performance report 209 that indicates predicted performance for the configuration. The aerodynamic performance report 209 is then transmitted to one or more clients 106 that indicated that the particular configuration was to be analyzed on their behalf. In this manner, the user of each of these clients 106 is informed when an aerodynamic performance report 209 for a particular configuration is available for further analysis.

The aerodynamic performance report 209 may be transmitted to the client(s) 106 in one of a number of ways. For example, the aerodynamic performance report 209 may be embodied in an electronic mail transmission to a predetermined address associated with the client 106. Alternatively, the aerodynamic performance report 209 may be posted to a predefined network site that is transmitted to the client 106 when the user accesses such a network site using the browser 176. Also, the aerodynamic performance report 209 may be faxed to a user or may be transmitted in some other manner.

The actual content of the aerodynamic performance report 209 may be as simple as a spreadsheet of calculated performance parameters of the configuration or may include a plot or graph of the flight envelope of the configuration or may be a comparison of multiple configurations using plots, graphs and spreadsheets. Alternatively, a visual display such as a thumbnail or other display may be created and displayed on the display device 153. Also, the aerodynamic performance report 209 may indicate any areas of significant differences between the configurations. For example, the portions of performance envelopes which overlap for the configurations may be unmarked, whereas the portions of a first configuration which are greater than the second configuration may be indicated in some manner, such as, for example, with hash marks leaning to the left and the portions of a second configuration which are greater than the first configuration may be indicated with hash marks leaning to the right or by generating a circle or box around the differing portions, etc.

In a second embodiment, the present invention provides for the aerodynamic performance system 179 that implements a client based model to calculate aerodynamic performance of several configurations to determine configurations requiring further analysis. The aerodynamic performance system 179 provides a simpler embodiment of the present invention in that the aerodynamic performance system is provided for a single client 106. A user may manipulate the graphical user interface 206 and the browser 176 to input any necessary vehicle settings and configuration data into the aerodynamic performance system 179. Alternatively, other types of user interfaces may be employed that do not use the browser 176. By manipulating the graphical user interface 206, the user may identify all configurations that are to be processed for various vehicle settings. The aerodynamic performance system 179 then performs the calculations and comparisons of a particular configuration for each vehicle setting in a similar manner to the aerodynamic performance system 136 using any one of the approaches previously described. Thereafter, the aerodynamic performance system 179 generates an aerodynamic performance report that is displayed to the client 106 on the display device 153 to inform the user of the aerodynamic performance characteristics of the analyzed configurations.

Figure 2:
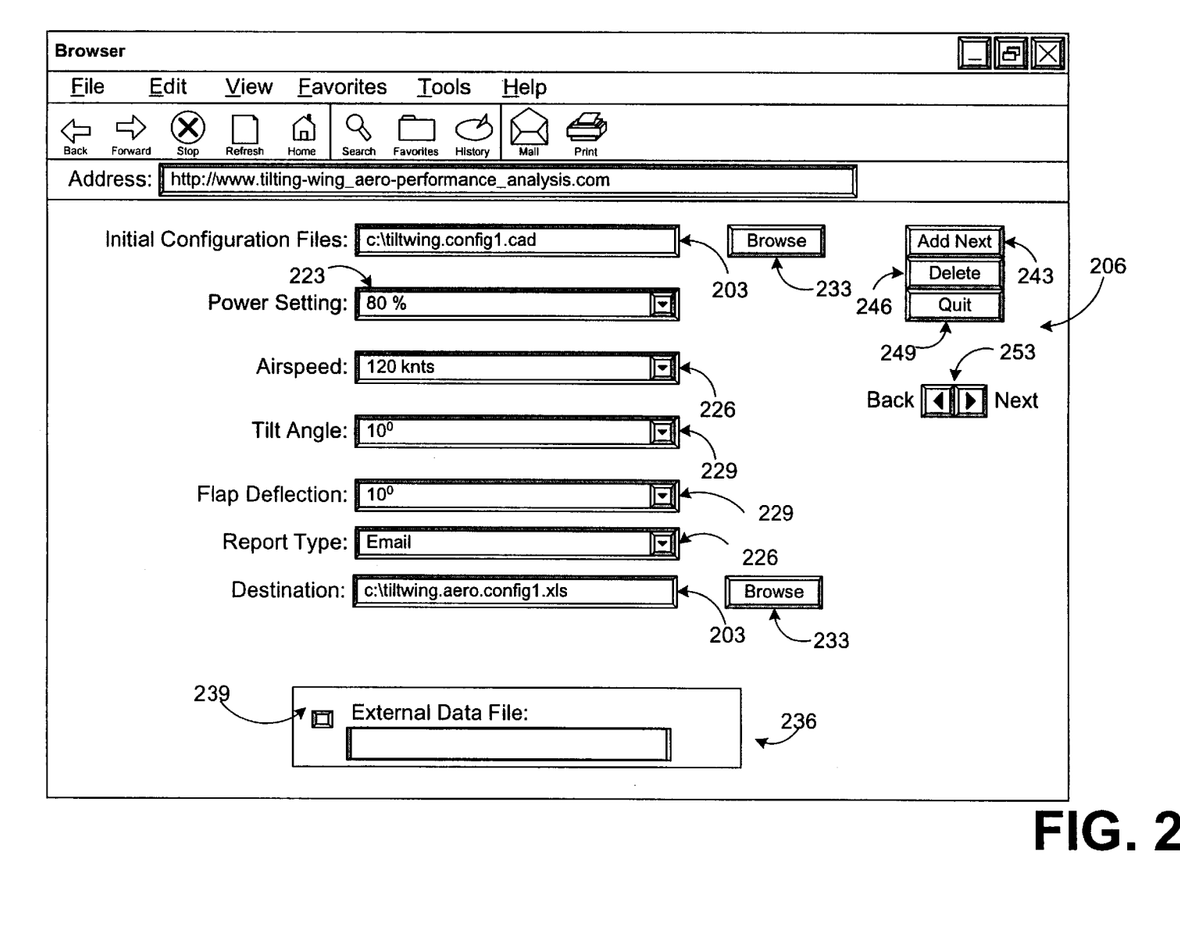
FIG. 2 is a graphical user interface displayed by the client of FIG. 1.

Turning to FIG. 2, shown is a depiction of a graphical user interface 206 according to an aspect of the present invention. The graphical user interface 206 may be employed to interface with the aerodynamic performance system 136 (FIG. 1) executed on the workstation 103 (FIG. 1) or the aerodynamic performance system 179 (FIG. 1) executed on the client 106 (FIG. 1). As shown in FIG. 2, the graphical user interface 206 is generated by the browser 176 as is generally known by those with ordinary skill in the art, although it may be generated in another manner. To manipulate any of the components in the graphical user interface 206, a user may position a cursor over the appropriate component with the mouse 159 (FIG. 2) and press on a button on the mouse 159. This is referred to as "clicking" on a particular component. In addition, text may be entered using the keyboard as is generally known by those with ordinary skill in the art.

The graphical user interface 206 includes a field that allows the user to enter the location of the initial configuration 203 that is to be analyzed by the aerodynamic performance system 136 or 179. The location may be the path on the network, hard drive, floppy disk or a uniform resource locator (URL). Also, the graphical user interface 206 includes a field for a power setting 212 that will be associated with the configuration. Additionally, the graphical user interface 206 includes a field for an airspeed 215 that will be associated with the configuration. Further, the graphical user interface 206 includes a field for a tilt angle 218 that will be associated with the configuration. Further still, the graphical user interface 206 includes a field for a flap deflection 221 that will be associated with the configuration. The graphical user interface 206 also includes a field by which the user may select a report type 224 that indicates the format of the aerodynamic performance report 209 (FIG. 1) that is generated by the aerodynamic performance system 136 or 179.

The graphical user interface 206 also includes a field for the report destination 227 that indicates a destination on the network 113 for the aerodynamic performance report 209. Note that the report type 224 and the report destination 227 may not be necessary in the context of the aerodynamic performance system 179 as any updates that are reported to the user need not travel to a separate device via the network 113 as should be apparent.

The graphical user interface 206 also includes a browse button 233 that enables the user to browse for the configuration to obtain the file location or the URL therefore as is generally known by those with ordinary skill in the art. There may also be a browse button 233 to enable the user to browse for a location to save a file to.

In addition, the graphical user interface 206 depicts a external data box 236 within which is a user interface component that may be employed by the user to specify various vehicle settings 239. For example, the user may specify a specific external file containing data for specific vehicle settings 239. Alternatively, other types of user interface components may be indicated. For example, a user interface may be provided wherein the user may input comments about the specific vehicle settings. Note that the components in the comparison event box 236 merely provide examples of such items, where other types of interfaces may be employed to specify other vehicle settings as should be apparent.

The graphical user interface 206 also includes "Add Next" button 243, a "Delete" button 246, and a "Quit" button 249. The "Add Next" button 243 may be clicked on by a user to add another configuration to be analyzed by the aerodynamic performance system 136 or 179. In particular, when the user clicks on the "Add Next" button 243, the various fields and components as depicted in FIG. 2 are shown as blank or with default information so that a user may specify a new configuration to be analyzed. In addition, the "Delete" button 246 allows a user delete a particular configuration from the aerodynamic performance system 136 or 179 so that configuration is no longer stored.

The "Quit" button 249 may be clicked on by the user to send the information altered by the user back to the aerodynamic performance system 136 or 179 to be included in the aerodynamic performance database 139 or 183, respectively. In addition, toggle buttons 253 are provided that enable the user to move between configurations to display the various details associated with each configuration individually. Thus, by manipulating the various components of the graphical user interface 206, a user may specify each of the configurations that are to be analyzed by the aerodynamic performance system 136 or 179. Specifically, the user may specify the initial configuration, the power setting 212, the airspeed 215, the tilt angle 218, the flap deflection 221, and the location and format of the aerodynamic performance report 209 that is generated in the case of the aerodynamic performance system 136.

The deflected-slipstream methodology developed in chapter 8 of the USAF Stability and Control DATCOM by project engineer D. E. Hoak is utilized to calculate lift and drag force increments due to thrust and flap deductions at angle-of-attack. The equivalent blowing coefficient and local geometry are used with jet-flap theory to determine the chordwise locations of the effective force centers of each blown wing section. The angle-of-attack contributions are assumed to act at the local aerodynamic center, and flap-induced contributions are assumed to act at the local center of pressure. With the force component increments and point of action identified, the moment contributions for each increment with respect to any moment reference center can be calculated with proper geometric translation of these force centers as functions of tilt angle.

Figure 3:
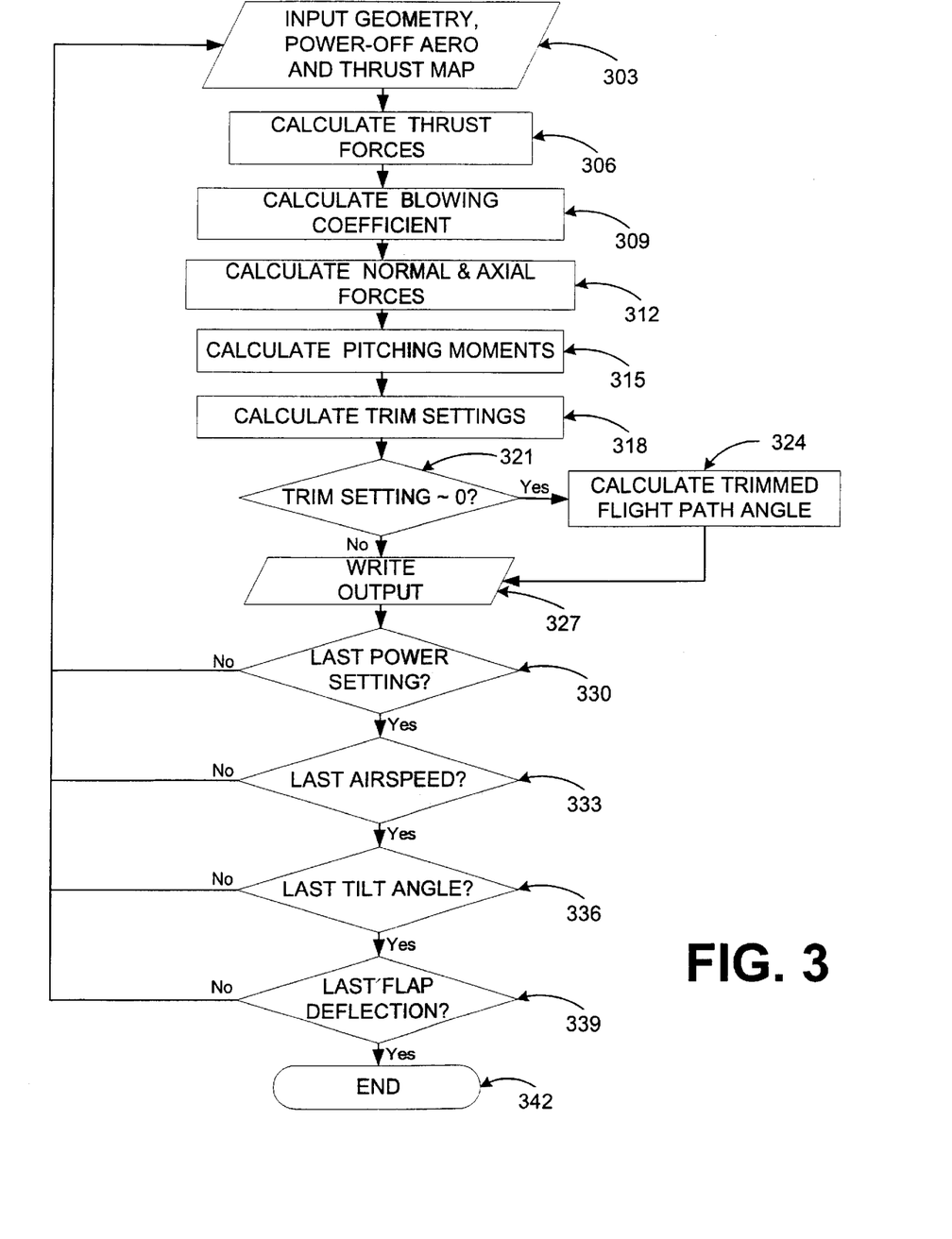
FIG. 3 is a flowchart illustrating an aerodynamic performance system for tilting wing aircraft executed on the workstation of FIG. 1.

Turning then to FIG. 3, shown is a flow chart of an operational aspect of the aerodynamic performance system 136 according to an aspect of the present invention. Alternatively, the flow chart of FIG. 3 may be viewed as depicting steps in a method implemented in the workstation 103. In the case that the aerodynamic performance system 136 is implemented in terms of software executable by the processor 123 and stored on the memory 126, several different programming languages may be employed, including, for example, C++, Fortran, or other proprietary scripting and programming languages native to the workstation 103. As stated previously, the aerodynamic performance system 136 is executed to calculate aerodynamic performance of various configurations (FIG. 1) for multiple clients 106 (FIG. 1).

Beginning with block 303, the aerodynamic performance system 136 first determines whether an initial configuration (FIG. 2) has been received from client 106. If such is the case then the aerodynamic performance system 136 proceeds to block 306 in which thrust forces are calculated in the aerodynamic performance system 136 and stored in the aerodynamic performance database 139 (FIG. 1). Static thrust vs. RPM and propeller blade geometry data is gathered externally and input into the program as described above. Propeller thrust at a given combination of airspeed and tilt angle is calculated with the Glauert method outlined by McCormack, B., in "Aerodynamics of V/STOL Flight", Academic Press, 1967, which uses an iterative method to solve for thrust as a function of the velocity ratio of flight speed to wash velocity. The corresponding propeller normal forces and thrust axis shift due to uneven lift distribution and disk angle-of-attack is then calculated.

Thereafter, in block 309 the blowing coefficient for use in the jet flap methodology is calculated based on the resulting prop thrust forces calculated in block 306. Next, in block 312, normal and axial forces are calculated in the aerodynamic performance system 136 and stored in the aerodynamic performance database 139. Power-off lift and drag forces are obtained from wind tunnel data or some other methodology and input into the program as described above. Power-on normal and axial forces as a function of thrust and flap setting over the blown section are estimated using the momentum theory for deflected slipstreams developed by Richard E. Kuhn, featured in the USAF Stability and Control DATCOM. Momentum theory consolidates lift, drag and thrust, resolving these constituents into net axial and normal force components at any given tilt angle, power and flap setting.

Thereafter, in block 315 the pitching moments are calculated in the aerodynamic performance system 136 and stored in the aerodynamic performance database 139 as well. Power-off aerodynamic moments due to airfoil section and fuselage camber are input into the program as described above. Power-on moments are calculated by summing the increments obtained for the momentum theory and flap theory for a series of flap deflections at a given tilt angle.

Next, in block 318 the aerodynamic performance system 136 calculates trim settings for the configuration. Trim deflections are calculated for fixed conditions of tilt angle, power settings and airspeed. Moment increments for each force component and corresponding deflection angles over a range of flap deflections are stored in arrays. When a configuration trim point is determined, respective flap deflections corresponding to the sectional moment increments are "backed out" using divided differencing to interpolate the arrays. The divided difference method is used because spline functions of moment increment vs. flap deflection generally fail if the function becomes double-valued. For blown wings, this is a common occurrence, resulting when net axial force over a given section reverses direction at some critical flap angle and blowing coefficient.

Re-calculating the axial and normal force increments at the trim flap settings and adding them to a zero-flap deflection reference value obtain trimmed normal and axial forces.

Then, in block 321, a comparison is performed for the trim setting of the configuration based upon predefined criteria. Specifically, trimmed flight path angle is determined in block 324 only for trim cases in which the configuration net normal force is, for example, between 0 and 1 to ensure that overall lifting force is equal to weight. This trimmed flight path angle is then stored the aerodynamic performance database 139. Otherwise, the aerodynamic performance system 136 proceeds to block 327.

In block 327, the performance parameters are written out to the aerodynamic performance database. Thereafter, the aerodynamic performance system 136 moves to block 330 in which it is determined whether the last power setting of all those identified in block 303 has been performed. If not, then the aerodynamic performance system 136 moves to block 303 in which the next power setting is identified in block 303 and further processing occurs until all power settings have been run. Thereafter, the aerodynamic performance system 136 proceeds back to block 333.

In block 333 it is determined whether the last airspeed for the configuration has been used. If further airspeeds remain, then the aerodynamic performance system 136 proceeds to block 303 in which the next airspeed is chosen out of those requested. Thereafter, aerodynamic performance system 136 proceeds to block 336.

In block 336 it is determined whether the last tilt angle for the configuration has been used. If further tilt angles remain, then the aerodynamic performance system 136 proceeds to block 303 in which the next tilt angle is chosen out of those requested. Thereafter, aerodynamic performance system 136 proceeds to block 339.

In block 339 it is determined whether the last flap deflection for the configuration has been used. If further flap deflections remain, then the aerodynamic performance system 136 proceeds to block 303 in which the next flap deflection is chosen out of those requested.

Assuming, however, that all of the configurations have been processed for all vehicle settings, then the aerodynamic performance system 136 proceeds to block 342 wherein the aerodynamic performance system 136 generates the aerodynamic performance report 209 (FIG. 1) for the identified client 106, transmits the aerodynamic performance report 209 to the client 106 and ends the program. Specifically, the aerodynamic performance report 209 may be embodied within an electronic mail message, for example, that is transmitted to the client 106 via a predefined address on the network 113 (FIG. 1). Alternatively, the aerodynamic performance report 209 may be posted to a configuration in the workstation 103 (FIG. 1), for example, and is downloaded to the client 106 when the user accesses such a configuration using the browser 176. In addition, other approaches may be employed to transmit the aerodynamic performance report 209 to the client 106.

The flow chart of FIG. 3 shows the architecture, functionality, and operation of an implementation of the aerodynamic performance systems 136 and 179. If embodied in software, each block may represent a module, segment, or portion of code that comprises one or more action statements in the form of executable instructions or declarations to implement the specified logical function(s). If embodied in hardware, each block may represent a circuit or a number of interconnected circuits to implement the specified logical function(s). Although the flow chart of FIG. 3 shows a specific order of execution, it is understood that the order of execution may differ from that which is depicted. For example, the order of execution of two or more blocks may be scrambled relative to the order shown. Also, two or more blocks shown in succession in FIG. 3 may be executed concurrently or with partial concurrence. It is understood that all such variations are within the scope of the present invention. Also, the flow chart of FIG. 3 is relatively self-explanatory and are understood by those with ordinary skill in the art to the extent that software and/or hardware can be created by one with ordinary skill in the art to carry out the various logical functions as described herein.

Also, the aerodynamic performance systems 136 and 179 can be embodied in any computer-readable medium for use by or in connection with an instruction execution system such as a computer/processor based system or other system that can fetch or obtain the logic from the computer-readable medium and execute the action statements including the instructions contained therein. In the context of this document, a "computer-readable medium" can be any medium that can contain, store, or maintain the aerodynamic performance systems 136 and 179 for use by or in connection with the instruction execution system. The computer readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, or compact disks. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

The system and method have been validated with test data. A powered model was used in the validation test of the method. The exploratory test recorded the relative magnitude of basic controls and power effects of flight control for the configuration to serve as a benchmark for development of flight control laws and calibration of analytical tools.

Predictions were compared to test data for different throttle and flap settings. For brevity, the data presented are for uniform deflections of all flaps, and a single power setting (approximately 35.6N per prop). Positive flap deflections are trailing-edge down. The quoted thrust per prop is a sea level static reference thrust derived from the prop manufacture's map of standard static thrust produced as a function of rpm. The variation of thrust with airspeed and disk angle is included via internal calculations within the program. Overall, the predictions suggest the analytical model may be used with a high degree of confidence in conceptual design variations of this configuration.

Figure 4:
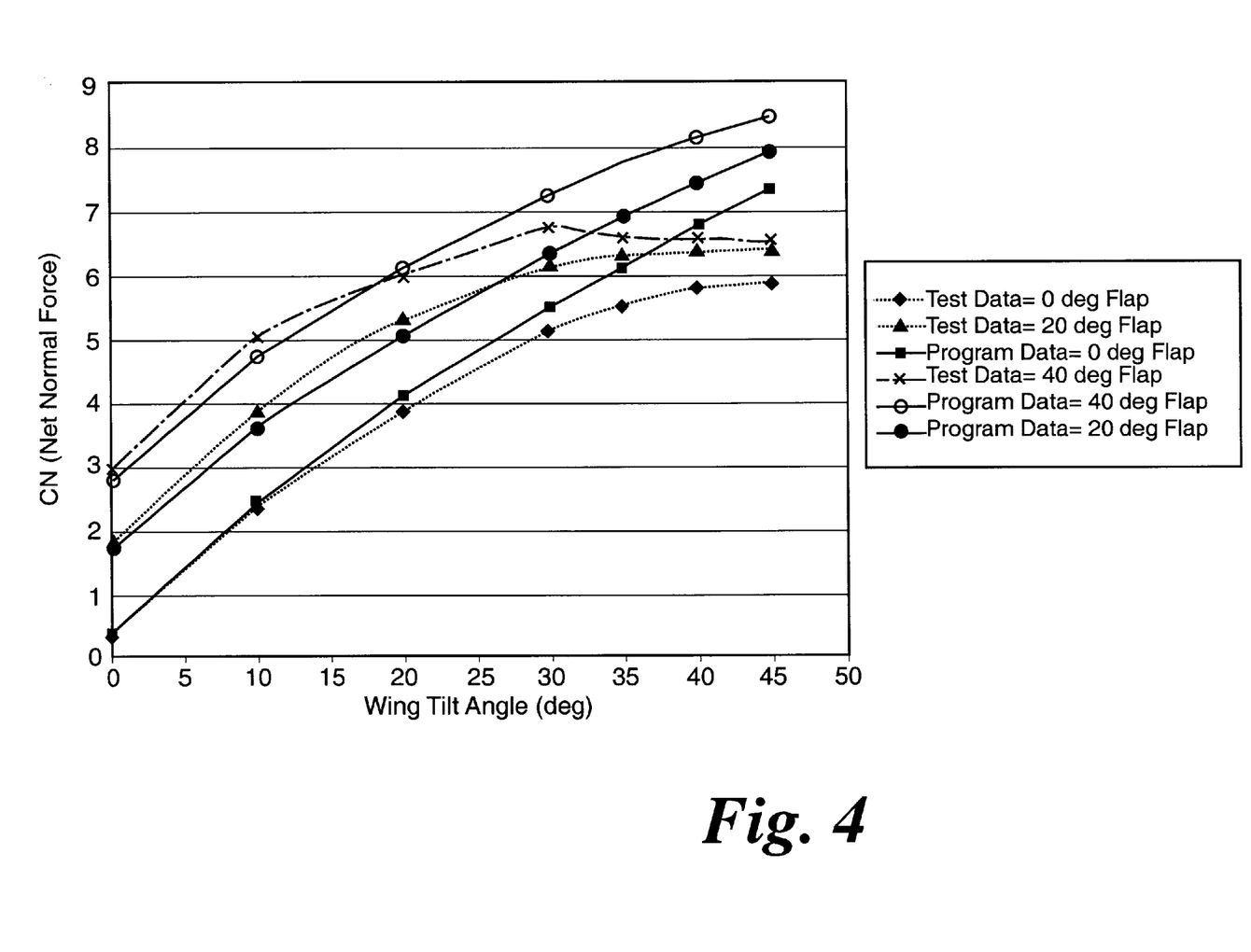
FIG. 4 is a normal force comparison.

Net normal force as a function of throttle setting, flap setting in wing incidence angle in FIG. 4 shows close correlation with the test data up to maximum lift/buffet onset. No leading edge devices were employed on the model. With the addition of properly designed leading edge flaps, the linear behavior in close correlation of normal force should persist over the full range of wing tilt angles.

Figure 5:
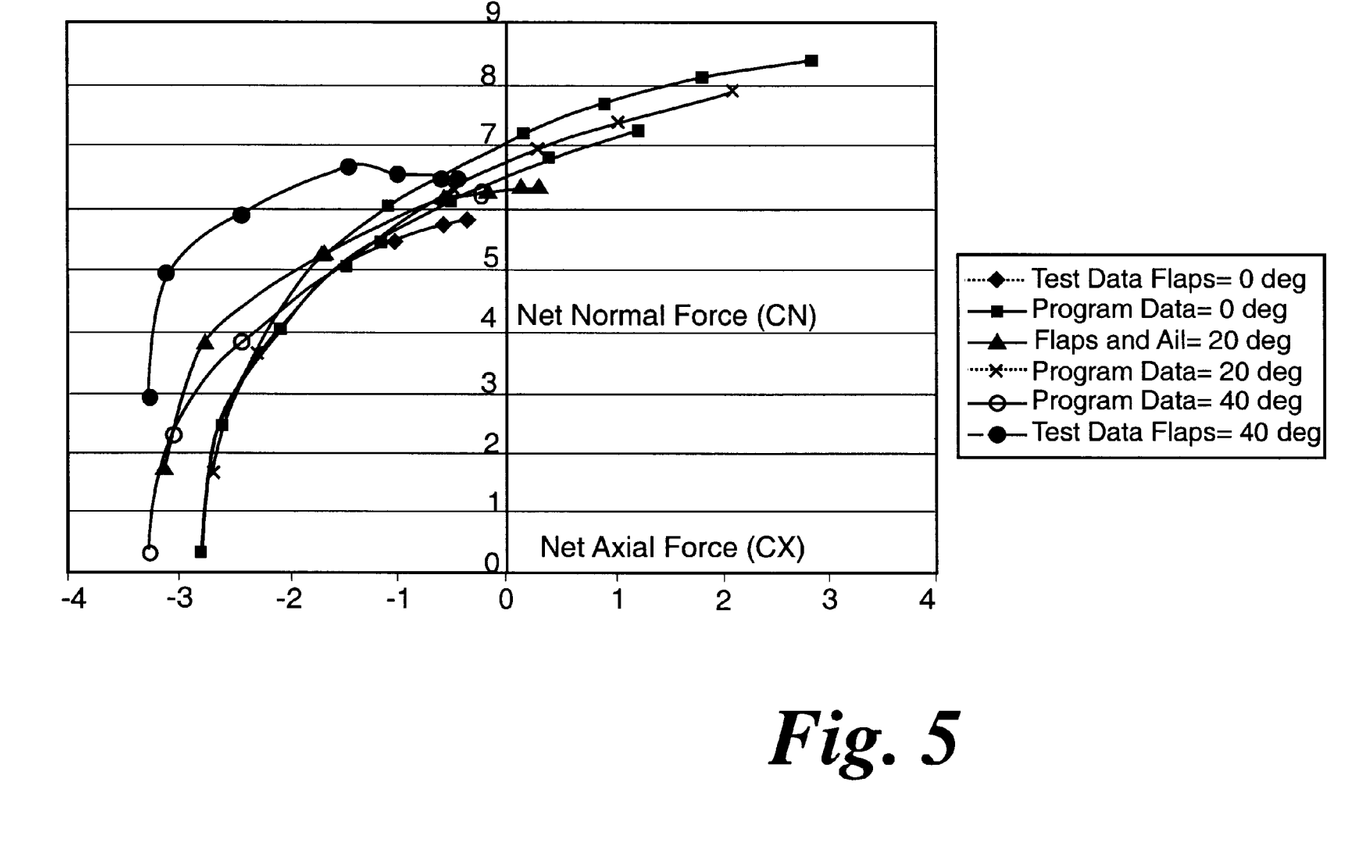
FIG. 5 is an axial force polar.

Axial force predictions of FIG. 5 closely match the magnitude and polar shape of the test data and regions where the normal force is linear with incidence angle, although there is a substantial discrepancy in zero-lift axial force. Zero-lift axial force is generally over predicted by the analytical model, relative to the test data. Installation effects and low skin friction due to laminar flow are potential sources of this inconsistency. The analytical model assumes turbulent flow, however, the model was not gritted for the test. Component build up of drag contributions not performed a quad by individual computers to zero-lift axial force, including mutual interference effects. Future test should include a "drag build up" matrix to isolate phenomena not captured by analytical method, and correct the method for configuration-specific anomalies.

In the test data, moments are calculated about the pivot. Pitching moment slopes are in reasonable agreement with curve-fit test data of FIG. 6, particularly the flattening and reversal indicated at higher tilt angles.

Figure 6:
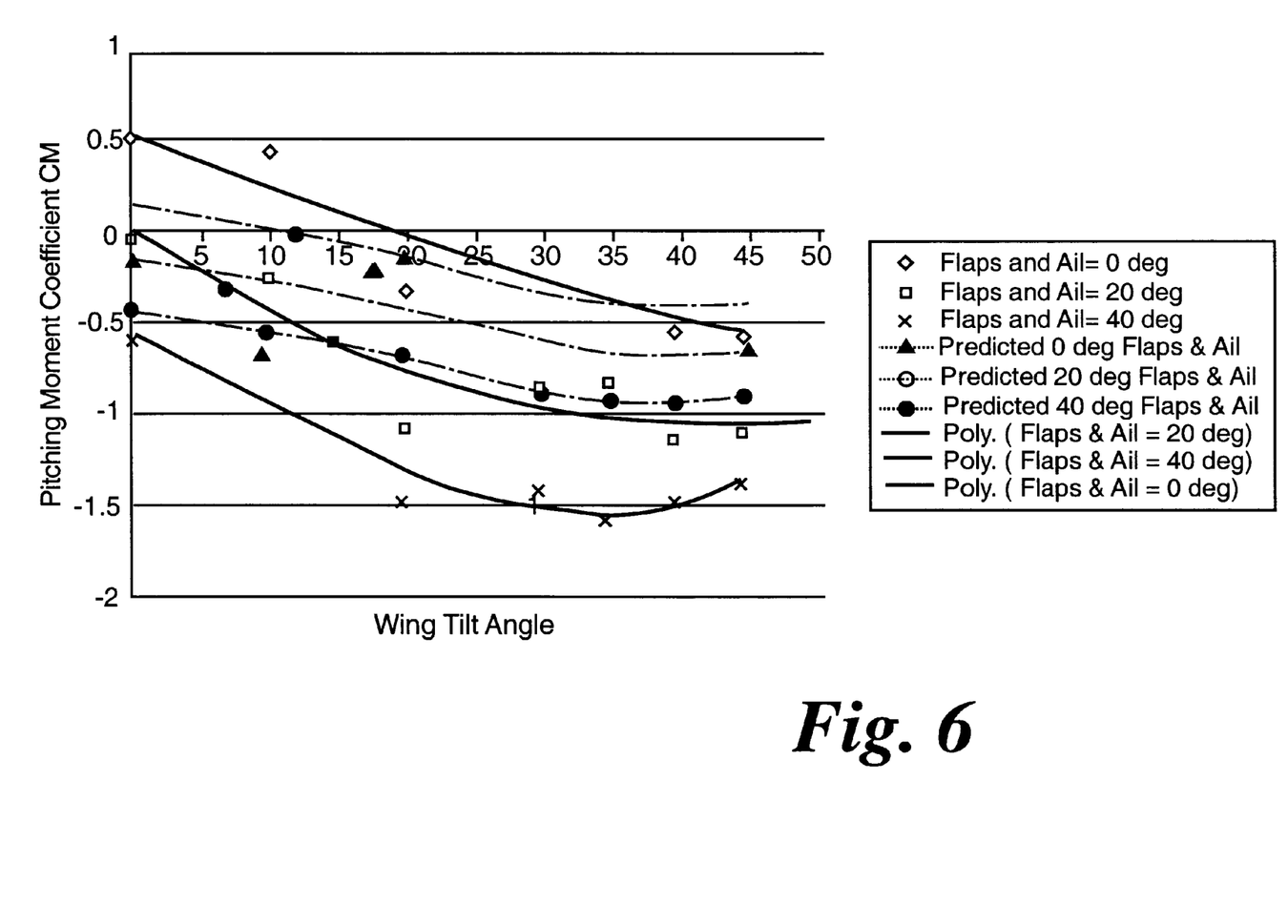
FIG. 6 is a pitching moment comparison.

The high degree of scattered in the test data suggests predictions for overall magnitude of pitching moment full generally near or within the error band for a given deflection. Given that the force and moment data were predicted by calculating individual contributions and summing them for the configuration, the overall agreement suggests the individual contribution estimates are sufficiently accurate or conceptual-level assessment of trim characteristics.

Figure 7:
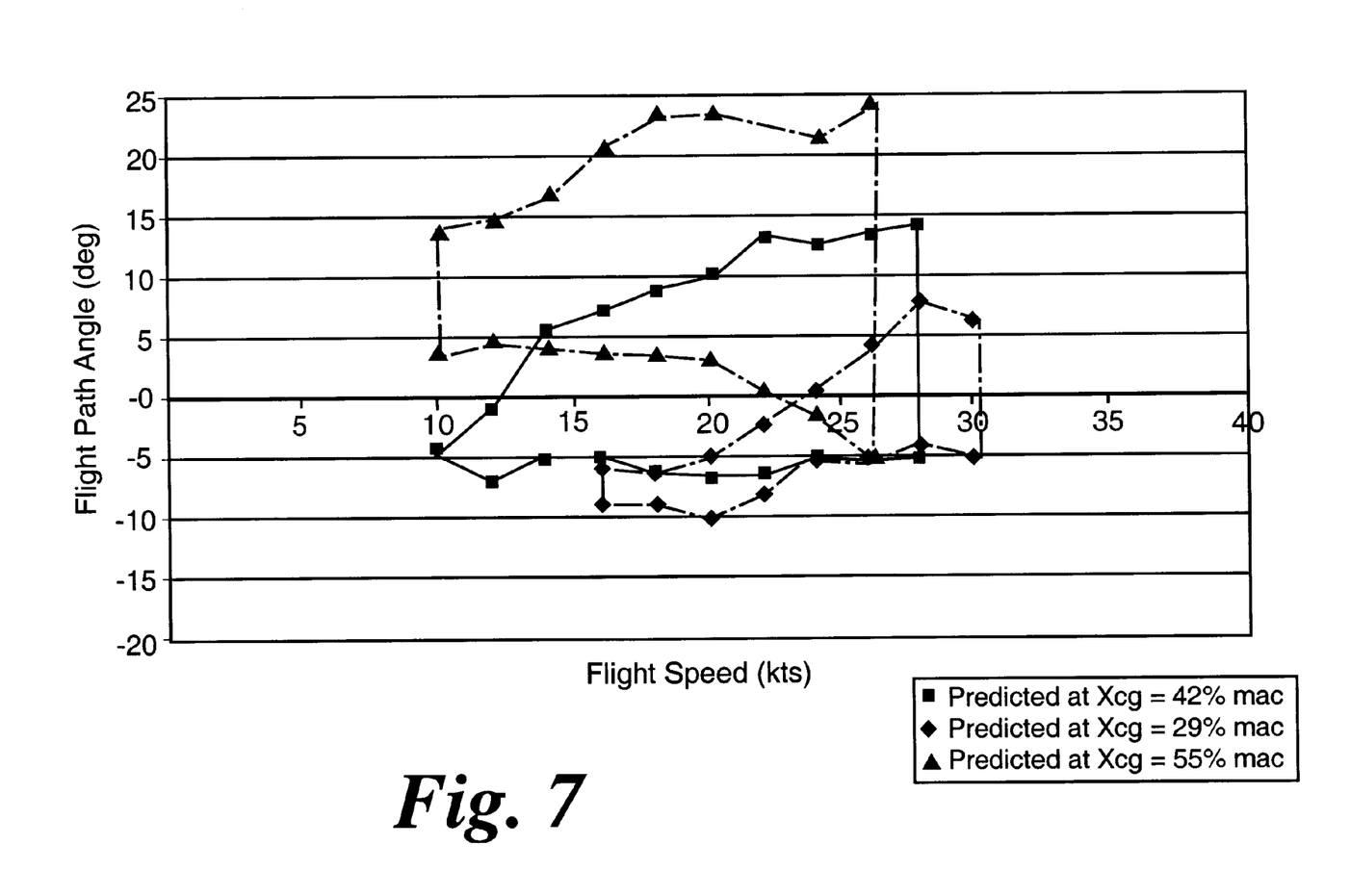
FIG. 7 is an estimated trimmed flight path V-gamma plot.

In STOL design, a flight envelope with a range of both positive and negative flight path angles at low speeds is desirable for maneuver margin. Predictions for the model over a range of cg locations and throttle settings are shown in FIG. 7. The model configuration exhibits a very small cg range for a flexible flight path envelope. Limited cg excursions of one inch (2.54 cm, six point percent Mac) forward or aft of the optimum result in extremely limited flight path options. At forward cg, the trim solutions tend to shift to descending flight. After cg locations tend to lead toward climb solutions. Extreme trim sensitivity to cg locations is a traditional problem in STOL design.

In this model, all of forces and moment arms are shifting as the wing tilts, because all the force generators are attached. This problem is further aggravated by the movement of the cg itself as a large portion of the overall model mass changes both vertical and horizontal displacement.

A full matrix of conceptual design arrangements may be studied to explore the practical limits of this fundamental trade with respect to any given vehicle performance goal.

Although particular embodiments of the invention have been described in detail, it is understood that the invention is not limited correspondingly in scope, but includes all changes, modifications and equivalents coming within the spirit and terms of the claims appended hereto.

What is claimed is:

1. An aerodynamic design system for designing aircrafts with tilting wing configurations in a workstation, comprising;
   a processor circuit having a processor and a memory;
   aerodynamic design logic stored on the memory and executable by the processor, the aerodynamic design logic comprising:
      logic that consists of inter-related calculations of thrust, normal force, axial force, pitching moment, trim, and flight path angles as functions of airspeed and tilt angle of the wing, wherein the logic further calculates a number of aerodynamic design parameters for a conceptual computer model; and
      logic that generates an aerodynamic design report for assisting in the design of a tilting wing aircraft to be sent to a client via a network, the aerodynamic design report listing at least one of the aerodynamic design parameters.

2. The aerodynamic performance system of claim 1, wherein the aerodynamic performance logic further comprises logic that transmits the aerodynamic performance report to the client via the network.

3. The aerodynamic performance system of claim 1, wherein the aerodynamic performance logic further comprises logic that posts the aerodynamic performance report to a workstation accessible by a user via the client through the network.

4. The system of claim 1, wherein the logic calculates a number of aerodynamic performance parameters in a number of configurations wherein the logic compares the aerodynamic performance parameters of at least one of the configurations with the aerodynamic performance parameters of another configuration.

5. The aerodynamic performance system of claim 2,
   wherein the logic that generates the aerodynamic performance report to be sent to the client via the network further comprises logic that embodies the aerodynamic performance report into an electronic mail message; and
   wherein the logic that transmits the aerodynamic performance report to the client via the network further comprises logic that transmits the electronic mail message to the client via the network.

6. The system of claim 4, wherein the logic that calculates a number of aerodynamic performance parameters in a number of configurations further comprises logic that calculates the number of aerodynamic performance parameters in the number of configurations wherein the configurations include a number of vehicle settings.

7. An aerodynamic design method for designing aircrafts with tilting wing configurations, comprising:
   calculating a number of aerodynamic design parameters for a conceptual computer model in a work station; and
   generating an aerodynamic design report in the workstation for assisting in the design of a tilting wing aircraft, the aerodynamic design report to be sent to a client via a network, the aerodynamic design report listing at least one of the aerodynamic design parameters.

8. The aerodynamic performance method of claim 7, further comprising transmitting the aerodynamic performance report to the client via the network.

9. The aerodynamic performance method of claim 8,
   wherein the step of generating the aerodynamic performance report in the workstation further comprises embodying the aerodynamic performance report into an electronic mail message; and
   wherein the step of transmitting the aerodynamic performance report to the client via the network further comprises transmitting the electronic mail message to the client via the network.

10. The aerodynamic performance method of claim 7, further comprising posting the aerodynamic performance report to a workstation that is accessible by a user via the client.

11. The aerodynamic performance method of claim 7, wherein the step of calculating the number of aerodynamic performance parameters in the number of configurations in the workstation further comprises comparing a the aerodynamic performance parameters of at least one of the configurations with the aerodynamic performance parameters of another configuration.

12. The aerodynamic performance method of claim 11, wherein the step of calculating the number of aerodynamic performance parameters in a number of configurations further comprises logic for calculating the number of aerodynamic performance parameters in the number of configurations wherein the configurations include a number of vehicle settings.

13. An aerodynamic design system for designing aircrafts with tilting wing configurations, comprising:

a processor circuit having a processor and a memory;

aerodynamic design logic stored on the memory and executable by the processor, the aerodynamic design logic comprising:

logic that consists of inter-related calculations of thrust, normal force, axial force, pitching moment, trim, and flight path angles as functions of airspeed and tilt angle of the wing, wherein the logic further calculates at least one aerodynamic design parameter for a conceptual computer model;

logic that generates an aerodynamic design report, the aerodynamic design report identifying the at least one aerodynamic design parameter; and logic that presents the aerodynamic design report to a user for assisting in the design of a tilting wing aircraft.

14. The aerodynamic performance system of claim 13, wherein the logic that presents the aerodynamic performance report to the user further comprises logic that displays the aerodynamic performance report in a graphical user interface on a display device.

15. The aerodynamic performance system of claim 13, wherein the logic that calculates a number of aerodynamic performance parameters in a number of configurations in the computer system further comprises logic that compares the aerodynamic performance parameters of at least one of the configurations with the aerodynamic performance parameters of another configuration.

16. The aerodynamic performance system of claim 15, wherein the logic that detects the at least one aerodynamic performance parameter in the configuration in the computer system further comprises logic that the number of aerodynamic performance parameters in the number of configurations wherein the configurations include a number of vehicle settings.

17. An aerodynamic design method for designing aircrafts with tilting wing configurations, comprising:

calculating at least one aerodynamic design parameter for a conceptual computer model in a computer system coupled to a network; and generating an aerodynamic design report for assisting in the design of a tilting wing aircraft in the computer system, the aerodynamic performance report identifying the at least one aerodynamic design parameter; and presenting the aerodynamic design report to a user.

18. The aerodynamic performance method of claim 17, wherein the step of presenting the aerodynamic performance report to the user further comprises displaying the aerodynamic performance report in a graphical user interface on a display device.

19. The aerodynamic performance method of claim 17, wherein the step of detecting the at least one aerodynamic performance parameter in the configuration in the computer system further comprises comparing aerodynamic performance parameters of at least one of the configurations with aerodynamic performance parameters of another configuration.

20. The aerodynamic performance method of claim 19, wherein the step of calculating the number of aerodynamic performance parameters in a number of configurations in the computer system further comprises calculating the number of aerodynamic performance parameters in the number of configurations wherein the configurations include a number of vehicle settings.

* * * * *